(12) United States Patent
Ishikawa et al.

(10) Patent No.: US 8,619,905 B2
(45) Date of Patent: Dec. 31, 2013

(54) PREDISTORTER AND DISTORTION COMPENSATION METHOD

(75) Inventors: Hiroyoshi Ishikawa, Kawasaki (JP);
Nobukazu Fudaba, Kawasaki (JP);
Yuichi Utsunomiya, Kawasaki (JP);
Kazuo Nagatani, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 412 days.

(21) Appl. No.: 12/693,695

(22) Filed: Jan. 26, 2010

(65) Prior Publication Data
US 2010/0194474 A1    Aug. 5, 2010

(30) Foreign Application Priority Data
Feb. 5, 2009    (JP) .................................. 2009-24413

(51) Int. Cl.
*H04K 1/02*    (2006.01)

(52) U.S. Cl.
USPC ........... 375/297; 375/271; 375/259; 375/295; 375/296; 455/429; 455/450; 455/571

(58) Field of Classification Search
USPC .......... 375/271, 259, 295, 296, 297; 455/429, 455/450, 571
See application file for complete search history.

(56) References Cited

U.S. PATENT DOCUMENTS

| | | | |
|---|---|---|---|
| 5,870,668 A | 2/1999 | Takano et al. | |
| 6,275,103 B1 | 8/2001 | Maniwa | |
| 2001/0005402 A1 | 6/2001 | Nagatani et al. | |
| 2001/0007435 A1* | 7/2001 | Ode et al. | 330/149 |
| 2004/0179629 A1* | 9/2004 | Song et al. | 375/296 |
| 2004/0212428 A1* | 10/2004 | Ode et al. | 330/149 |
| 2005/0068102 A1 | 3/2005 | Hongo et al. | |
| 2005/0253652 A1* | 11/2005 | Song et al. | 330/149 |
| 2005/0258898 A1 | 11/2005 | Hongo | |
| 2006/0240786 A1 | 10/2006 | Liu | |

FOREIGN PATENT DOCUMENTS

| | | |
|---|---|---|
| EP | 1 204 216 | 5/2002 |
| EP | 1 511 179 | 3/2005 |
| EP | 1 511 180 | 3/2005 |
| JP | 9-69733 | 3/1997 |
| JP | 2000-78037 | 3/2000 |
| JP | 2004-80770 | 3/2004 |
| JP | 2004-172676 | 6/2004 |
| JP | 2004-289542 | 10/2004 |

(Continued)

OTHER PUBLICATIONS

European Search Report dated Apr. 29, 2010, from the corresponding European Application.

(Continued)

*Primary Examiner* — Zewdu Kassa
(74) *Attorney, Agent, or Firm* — Katten Muchin Rosenman LLP

(57) ABSTRACT

A predistorter includes a distortion compensating unit which gives, in advance, a reverse characteristic of a characteristic of input to output of a power amplifier to a transmission signal which is to be input to the power amplifier; a distortion compensation signal generating unit which generates a distortion compensation signal indicating the reverse characteristic based on transmission data that is sample data of the transmission signal and the delayed transmission data; and a delay amount control unit which controls a delay amount of the transmission data according to an output signal of the power amplifier.

13 Claims, 18 Drawing Sheets

(56) References Cited

FOREIGN PATENT DOCUMENTS

| | | |
|---|---|---|
| JP | 2005-101908 | 4/2005 |
| JP | 2005-333353 | 12/2005 |
| WO | 02/087097 | 10/2002 |
| WO | 2004/040870 | 5/2004 |
| WO | 2007/004252 | 1/2007 |

OTHER PUBLICATIONS

European Communication pursuant to Article 94(3) EPC dated Mar. 24, 2011, from the corresponding European Application.

Notification of Reason for Refusal dated Sep. 11, 2012, from corresponding Japanese Application No. 2009-024413.

\* cited by examiner

PREDISTORTER AND DISTORTION COMPENSATION METHOD

CROSS-REFERENCE TO RELATED APPLICATION

This application is based upon and claims the benefit of priority of the prior Japanese Patent Application No. 2009-024413, filed on Feb. 5, 2009, the entire contents of which are incorporated herein by reference.

FIELD

Embodiments of the present invention relate to a predistorter that performs distortion compensation of a power amplifier and to a distortion compensation method.

BACKGROUND

The power amplifier used for radio communication is required to have high power efficiency. In general, however, linearity and power efficiency of the power amplifier have mutually contradictory characteristics. To achieve a balance between the linearity and the power efficiency, various distortion compensation methods have been proposed.

A predistorter has been known as one of the above-described distortion compensation methods. The predistorter is a method for obtaining a desired signal without distortion in an output of the power amplifier by previously adding a characteristic that is reverse to a distortion characteristic of an amplifier with respect to an input signal of the power amplifier. Furthermore, various methods have been proposed as a predistorter that compensates nonlinear distortion (amplitude distortion and phase distortion) of the power amplifier and hysteresis that is called a memory effect (see, for example, Japanese Laid-Open Patent Publication No. Hei 09-69733 and Japanese Laid-Open Patent Publication No. 2000-78037).

FIG. 1 illustrates a configuration diagram of an example of a conventional predistorter. In FIG. 1, transmission data I and Q are supplied to a terminal 1. The transmission data I and Q are supplied to a multiplier 2, an address generating unit 3, and a subtractor 4.

Based on an increase in the amplitude and the phase of the transmission data I and Q, the address generating unit 3 generates addresses (a one-dimensional address and a two-dimensional address) of a distortion compensation coefficient generating unit 5. A distortion compensation coefficient is read out from the distortion compensation coefficient generating unit 5 by these addresses and is then supplied to the multiplier 2.

The multiplier 2 performs complex multiplication of the transmission data I and Q by the distortion compensation coefficient. The output of the multiplier 2 is converted into an analog signal by a DA converter 6 and is then supplied to a quadrature modulator 7 to be quadrature-modulated. The radio frequency quadrature-modulated signal that is output from the quadrature modulator 7 is power-amplified by a power amplifier 8 and is then output from a terminal 10 through a directional coupler 9.

Some of the radio frequency quadrature-modulated signals are taken out from the directional coupler 9 and are then frequency-converted into intermediate frequency (IF) signals by a frequency converter 12. The IF signal is converted into a digital signal by an AD converter 13 and is then supplied to a quadrature demodulator 14. The quadrature demodulator 14 performs quadrature demodulation of the digital IF signal. The demodulated data I and Q are supplied to the subtractor 4 and a coefficient updating unit 15.

The subtractor 4 calculates a difference (error) between the transmission data I and Q from the terminal 1 and the demodulated data I and Q and then supplies the difference to the coefficient updating unit 15. There is a delay unit (not illustrated) between the terminal 1 and the subtractor 4. The delay unit performs time adjustment between the transmission data I and Q and the demodulated data I and Q.

Based on the distortion compensation coefficient read out from the distortion compensation coefficient generating unit 5, the difference, and the demodulated data I and Q, the coefficient updating unit 15 calculates an updated distortion compensation coefficient. Next, a new distortion compensation coefficient, obtained by adding the updated distortion compensation coefficient and the distortion compensation coefficient read out from the distortion compensation coefficient generating unit 5, is supplied to the distortion compensation coefficient generating unit 5. Accordingly, the distortion compensation coefficient of the distortion compensation coefficient generating unit 5 is updated.

FIG. 2 and FIG. 3 illustrate configuration diagrams of examples of the address generating unit 3 in a conventional predistorter. In FIG. 2, a power calculating unit 3a calculates a power value based on the transmission data I and Q. A subtractor 3c obtains a differential power between a power value output from the powΔer calculating unit 3a and a power value obtained by delaying this power value by a one clock delay unit 3b. The power value is output as a one-dimensional address, and the differential power is output as a two-dimensional address.

In FIG. 3, the power calculating unit 3a calculates a power value based on the transmission data I and Q. A differentiation/integration circuit unit 3d calculates a differentiation value or an integration value of the power value output from the power calculating unit 3a. The power value is output as a one-dimensional address, and the differentiation value or the integration value is output as a two-dimensional address.

FIG. 4 illustrates a configuration diagram of another example of the conventional predistorter. In FIG. 4, the transmission data I and Q are supplied to a terminal 21. The transmission data I and Q are supplied to a multiplier 22, a delay unit 23, a subtractor 24, and a series method distortion compensation unit 25. The delay unit 23 delays the transmission data I and Q by a specified time to supply the transmission data I and Q as delay data to the series method distortion compensation unit 25.

The series method distortion compensation unit 25 generates a distortion compensation coefficient by using a Volterra series or the like based on the transmission data I and Q and the delay data, and then supplies the distortion compensation coefficient to the multiplier 22.

The multiplier 22 performs the complex multiplication of the transmission data I and Q by the distortion compensation coefficient. The output of the multiplier 22 is converted into an analog signal by a DA converter 26 and is then supplied to a quadrature modulator 27 to be quadrature-modulated. The radio frequency quadrature-modulated signal that is output from the quadrature modulator 27 is power-amplified by the power amplifier 28 and is then output from a terminal 30 through a directional coupler 29.

Some of the radio frequency quadrature-modulated signals are taken out from the directional coupler 29 and are then frequency-converted into IF signals by a frequency convertor 32. The IF signal is converted into a digital signal by an AD converter 33 and is then supplied to a quadrature demodulator 34. The quadrature demodulator 34 performs the quadrature demodulation of the digital IF signal. The demodulated data I and Q are supplied to the subtractor 24 and a coefficient updating unit 35.

The subtractor 24 calculates the difference between the transmission data I and Q and the demodulated data I and Q from the terminal 21 and then supplies the difference to the coefficient updating unit 15. There is a delay unit (not illustrated) between the terminal 21 and the subtractor 24. The delay unit performs the time adjustment between the transmission data I and Q and the demodulated data I and Q.

Based on the distortion compensation coefficient generated by the series method distortion compensation unit 25, the difference, and the demodulated data I and Q, the coefficient updating unit 35 calculates an updated distortion compensation coefficient. Next, a new distortion compensation coefficient, obtained by adding the updated distortion compensation coefficient, the distortion compensation coefficient generated by the series method distortion compensation unit 25, and the distortion compensation coefficient output from the series method distortion compensation unit 25, is supplied to the series method distortion compensation unit 25. Accordingly, the distortion compensation coefficient of the series method distortion compensation unit 25 is updated.

Hysteresis of the power amplifier is a phenomenon in which a present signal is influenced by a past signal. The degree of the influence of the hysteresis may vary. As for the conventional predistorter, a delay amount in case of generating a delay signal depending on the degree of the influence of the hysteresis is fixed, and there was no idea that the delay amount is changed. Because of this, there has been a problem that the hysteresis of the power amplifier is not compensated sufficiently.

SUMMARY

According to an aspect of the embodiments discussed herein, a predistorter includes a distortion compensating unit which gives, in advance, a reverse characteristic of a characteristic of input to output of a power amplifier to a transmission signal which is to be input to the power amplifier; a distortion compensation signal generating unit which generates a distortion compensation signal indicating the reverse characteristic based on transmission data that is sample data of the transmission signal and the delayed transmission data; and a delay amount control unit which controls a delay amount of the transmission data according to an output signal of the power amplifier.

It is to be understood that both the foregoing general description and the following detailed description are exemplary and explanatory and are not restrictive of the embodiments, as claimed.

DESCRIPTION OF EMBODIMENTS

Description will be made below of embodiments based on the figures.

(First Embodiment)

Figure 1:
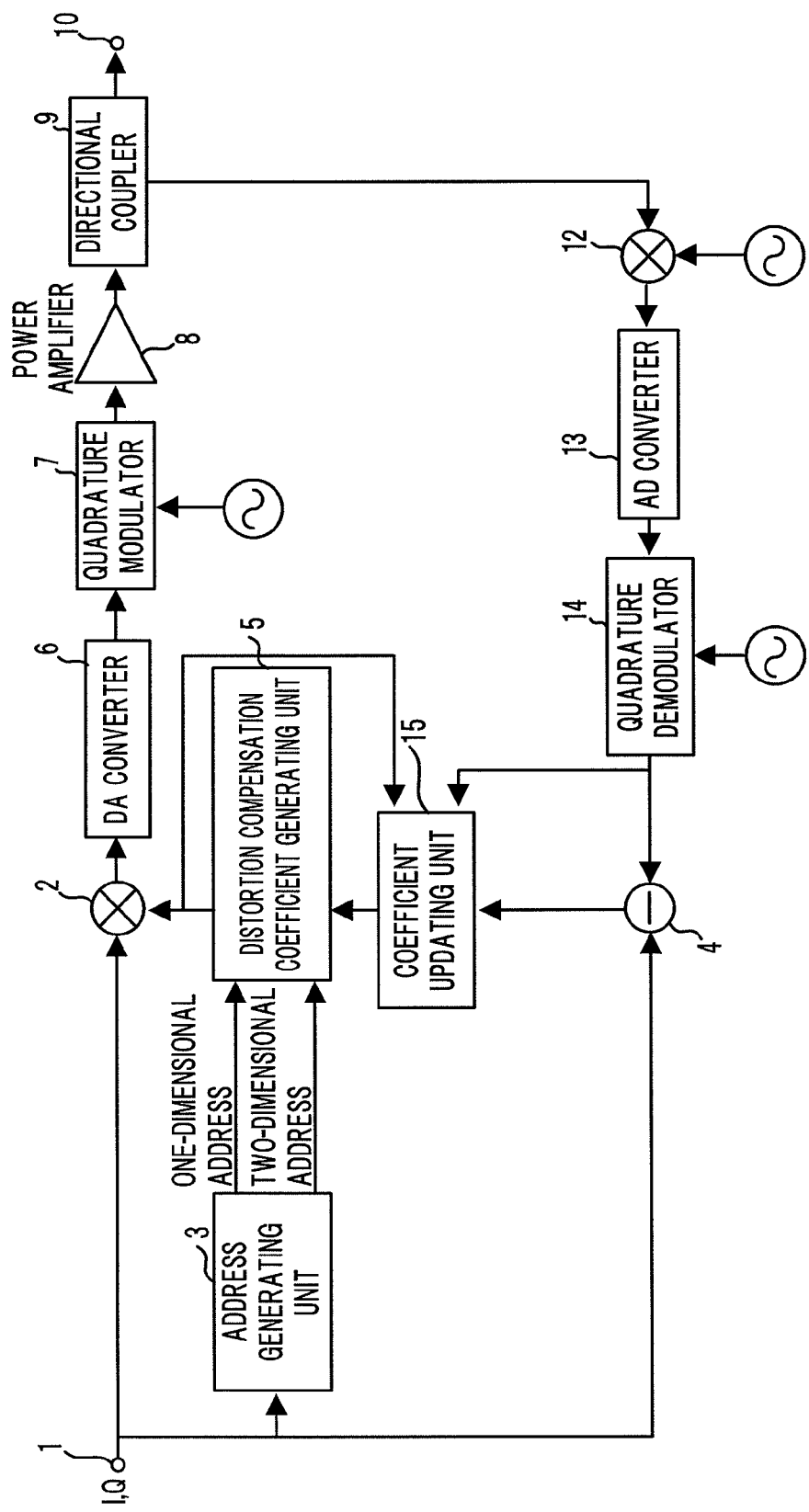
FIG. 1 is a configuration diagram of an example of a conventional predistorter.
Figure 2:
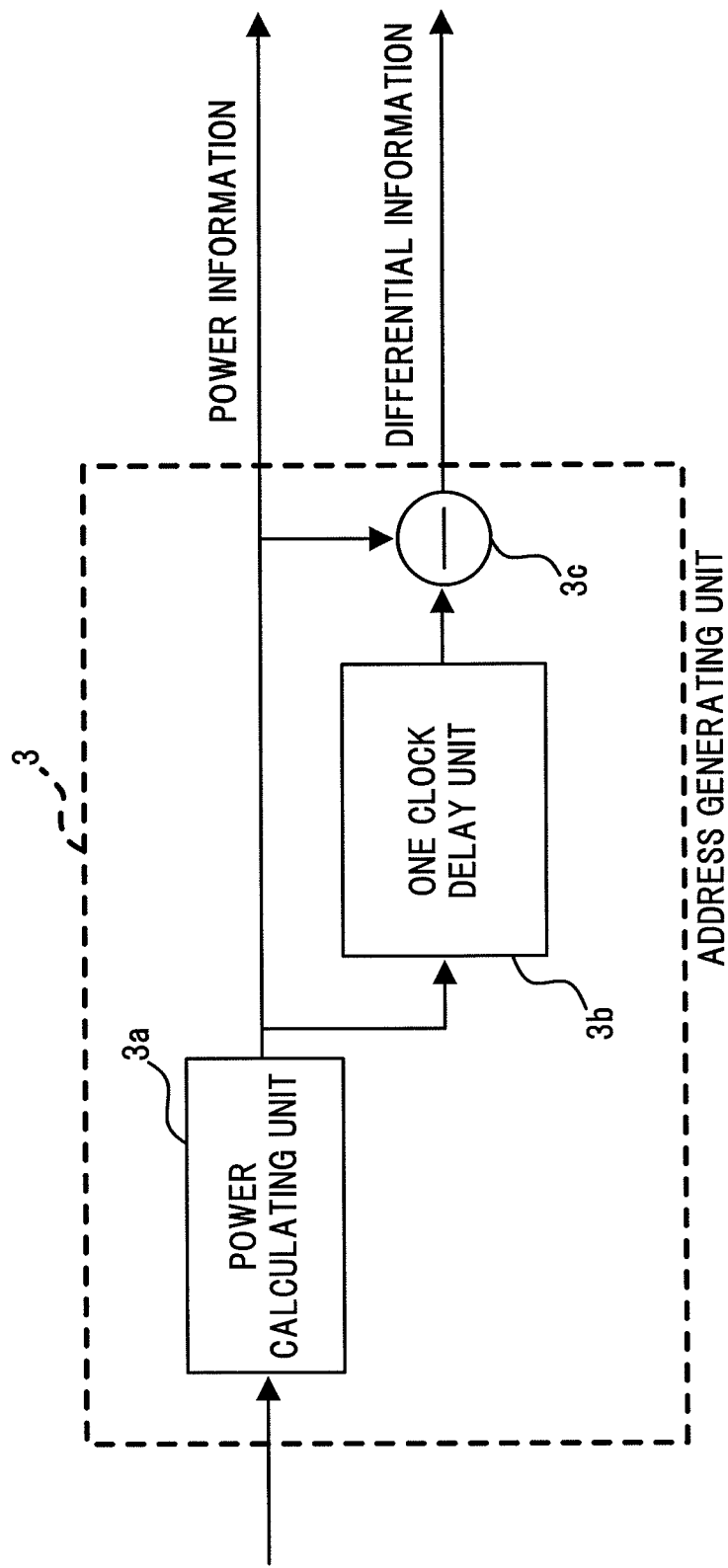
FIG. 2 is a configuration diagram of an example of a conventional address generating unit.
Figure 3:
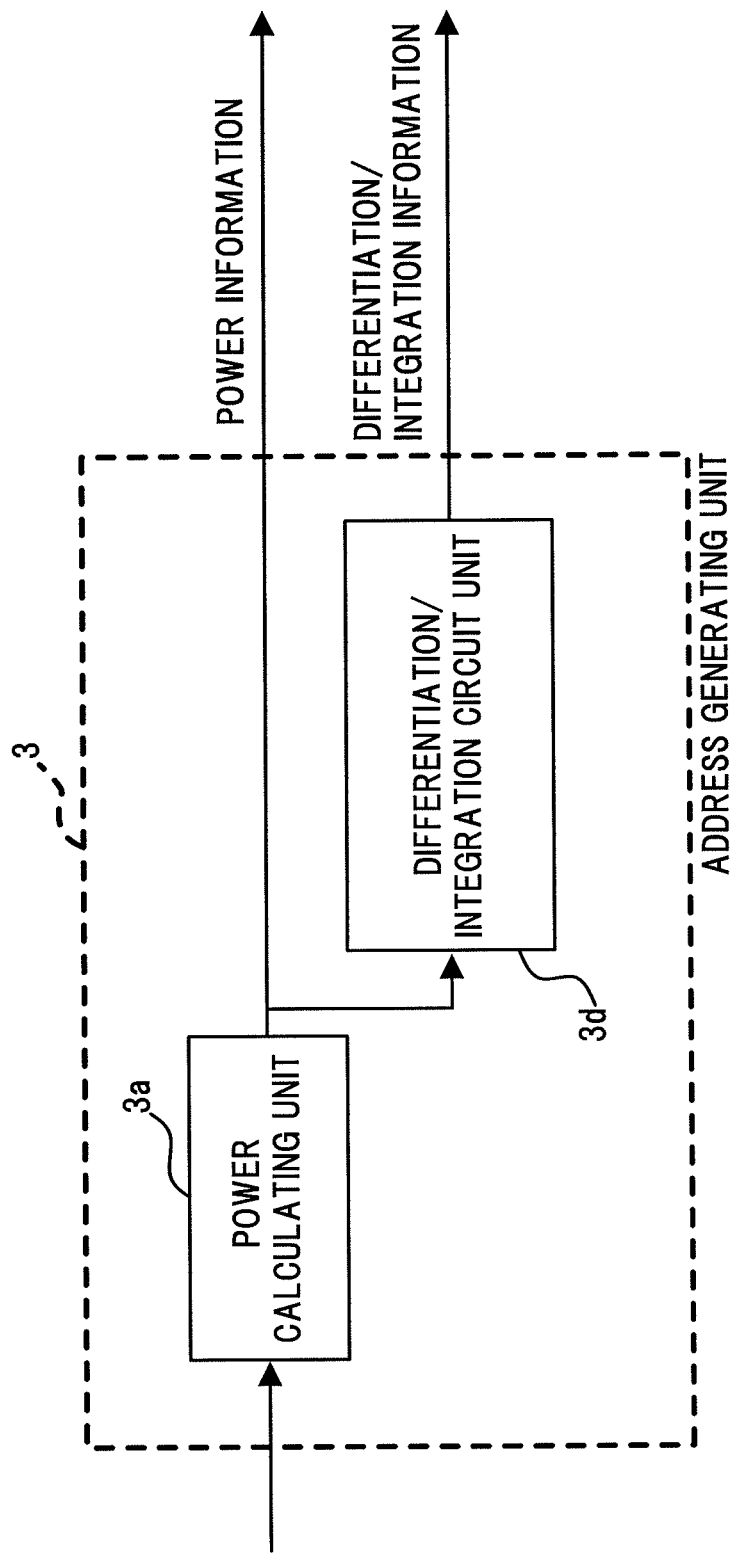
FIG. 3 is a configuration diagram of another example of the conventional address generating unit.
Figure 4:
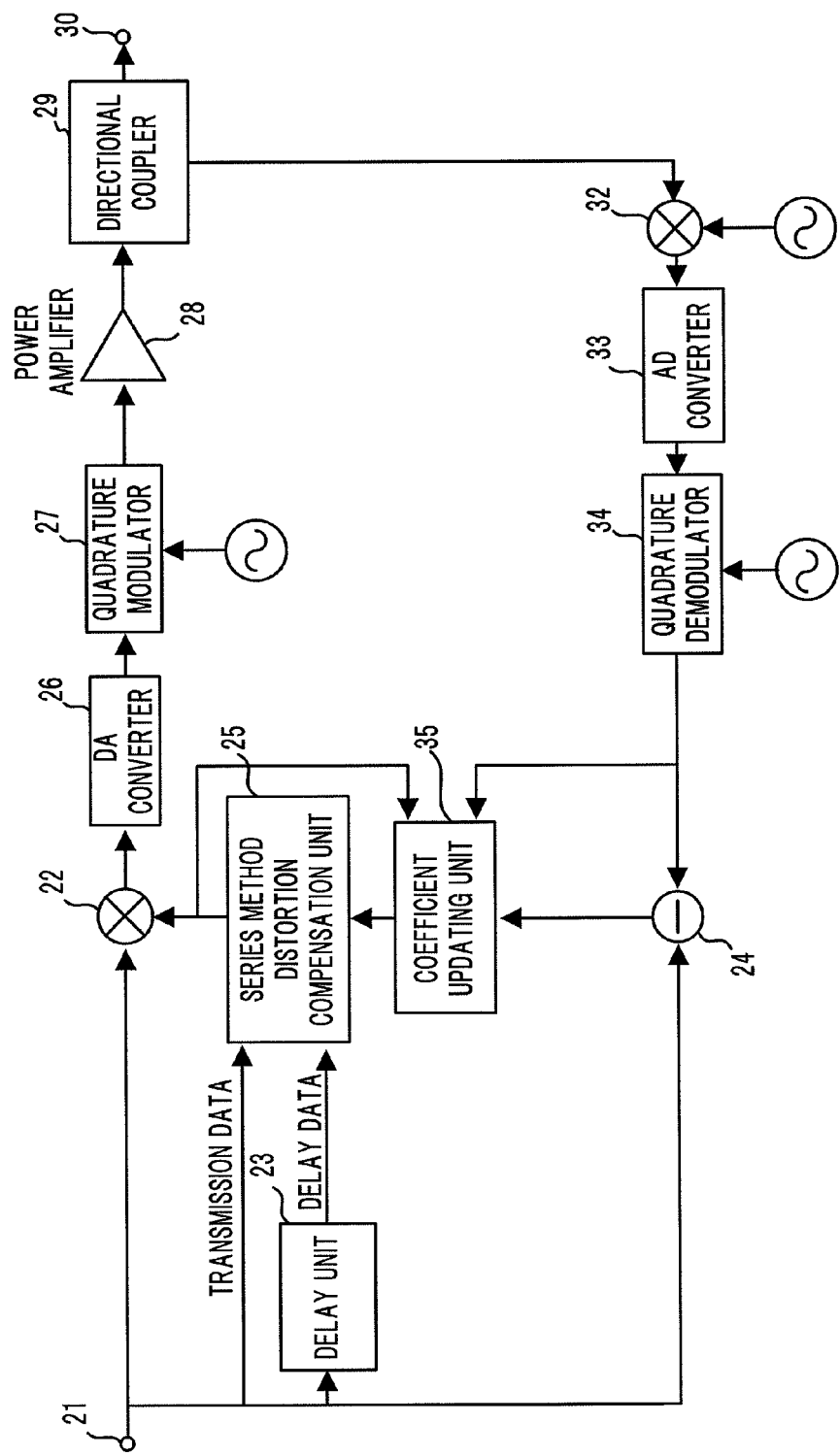
FIG. 4 is a configuration diagram of another example of the conventional predistorter.
Figure 5:
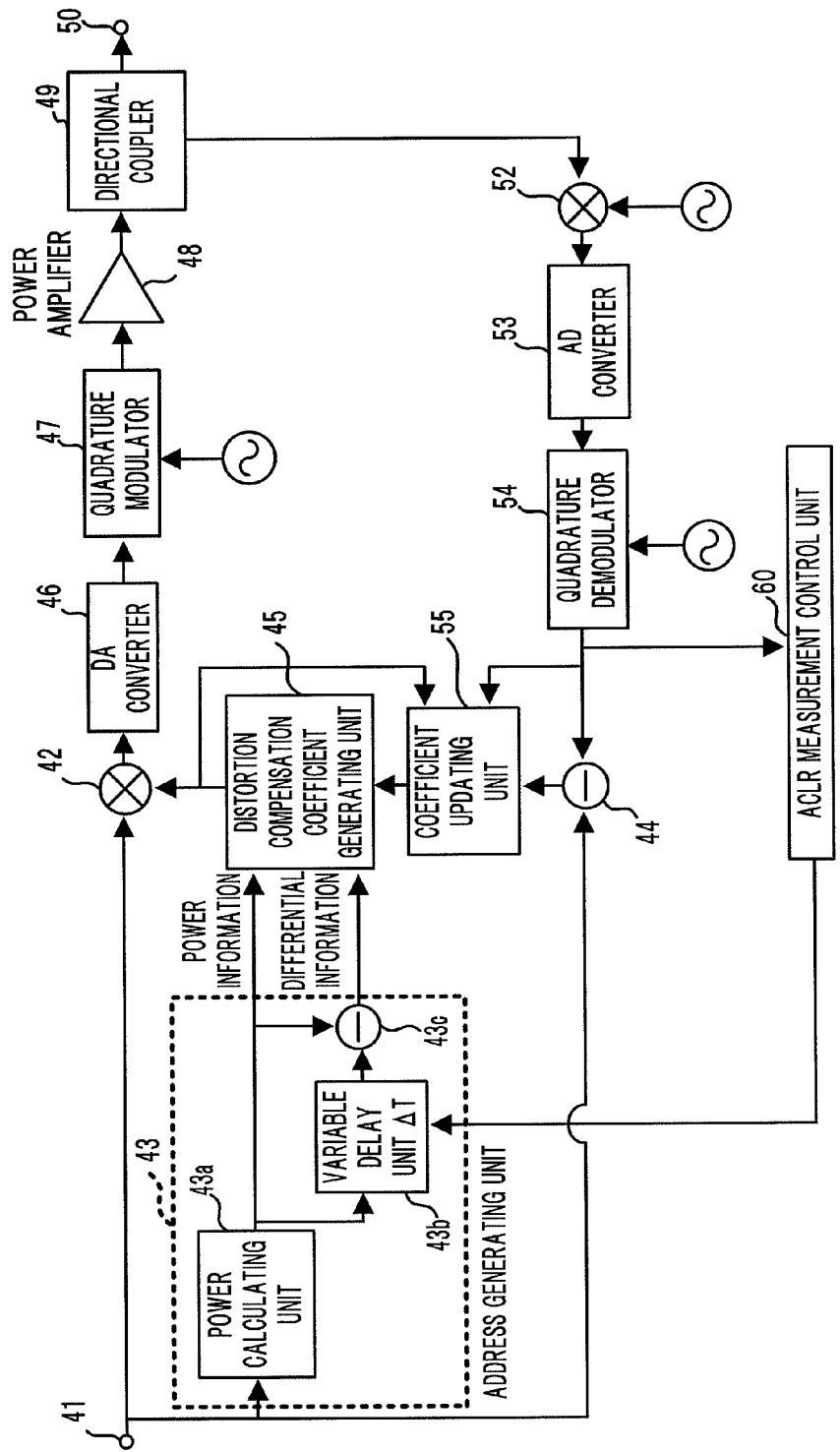
FIG. 5 is a configuration diagram of a first embodiment of a predistorter.

FIG. 5 is a configuration diagram of a first embodiment of a predistorter. In FIG. 5, transmission data I and Q as sample data of a transmission signal are supplied to a terminal 41. The transmission data I and Q are supplied to a multiplier 42, an address generating unit 43, and a subtractor 44.

The address generating unit 43 includes a power calculating unit 43a, a variable delay unit 43b, and a subtractor 43c. The power calculating unit 43a calculates a power value based on the transmission data I and Q. The subtractor 43c calculates a differential power between the power value that is output from the power calculating unit 43a and the power value obtained by delaying this power value by the variable delay unit 43b. The power value is output as a one-dimensional address, and the differential power is output as a two-dimensional address. The variable delay unit 43b varies a delay time ΔT according to a control signal supplied from an ACLR measurement control unit 60.

The addresses (the one-dimensional address and the two-dimensional address) output from the address generating unit 43 are supplied to a distortion compensation coefficient generating unit 45. The distortion compensation coefficient generating unit 45 reads out a distortion compensation coefficient from a two-dimensional Look-Up Table LUT based on the above-described addresses, and then supplies the distortion compensation coefficient to the multiplier 42.

The multiplier 42 performs the complex multiplication of the transmission data I and Q by the distortion compensation coefficient. The distortion compensation coefficient is an example of a distortion compensation signal indicating a reverse characteristic of a characteristic of input to output in an amplifier of a power amplifier 48 to a transmission signal which is to be input to the power amplifier. The output of the multiplier 42 is converted into an analog signal by a DA converter 46 and is then supplied to a quadrature modulator 47 to be quadrature-modulated. The radio frequency quadrature-modulated signal that is output from the quadrature modulator 47 is power-amplified by a power amplifier 48 and is then output from a terminal 50 through a directional coupler 49.

Some of the radio frequency quadrature-modulated signals are taken out from the directional coupler 49 and are then frequency-converted into IF signals by a frequency converter 52. The IF signal is converted into a digital signal by an AD converter 53 and is then supplied to a quadrature demodulator 54. The quadrature demodulator 54 performs the quadrature demodulation of the digital IF signal. The demodulated data I and Q are supplied to the subtractor 44, a coefficient updating unit 55, and the ACLR measurement control unit 60.

Figure 6:
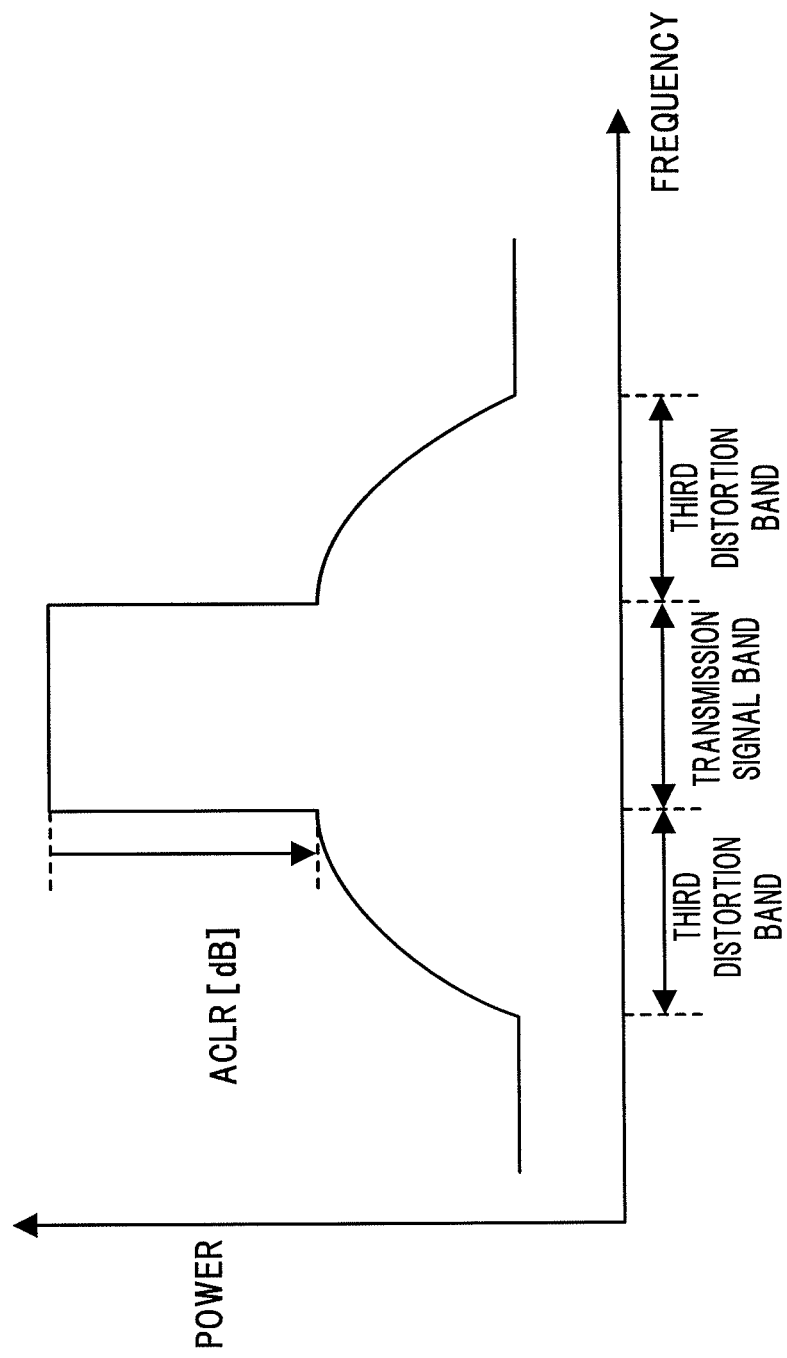
FIG. 6 is a diagram illustrating a frequency power spectrum of a transmission signal.

The ALCR measurement control unit 60 obtains an Adjacent Channel Leakage power Ratio (ACLR), which is measured based on the demodulated data I and Q, by using a Fast Fourier Transform (FFT) or the like, and then variably controls the delay time ΔT of the variable delay unit 43b in such a way that the ACLR has a desirable value. FIG. 6 is illustrates a frequency power spectrum of a transmission signal. The ACLR is indicated as a difference [dB] between the power of the transmission signal band and the power of the neighboring bands.

The subtractor 44 calculates the difference (error) between the transmission data I and Q and the demodulated data I and Q and then supplies the difference to the coefficient updating unit 55. There is a delay unit (not illustrated) between the terminal 41 and the subtractor 44. The delay unit performs the time adjustment between the transmission data I and Q and the demodulated data I and Q.

Based on the distortion compensation coefficient that is read out from the distortion compensation coefficient generating unit 45, the difference, and the demodulated data I and Q, the coefficient updating unit 55 obtains the updated distortion compensation coefficient. Next, a new distortion compensation coefficient, obtained by adding the updated distortion compensation coefficient and the distortion compensation coefficient read out from the distortion compensation coefficient generating unit 45, is supplied to the distortion compensation coefficient generating unit 45. Accordingly, the distortion compensation coefficient of the distortion compensation coefficient generating unit 45 is updated.

Figure 7:
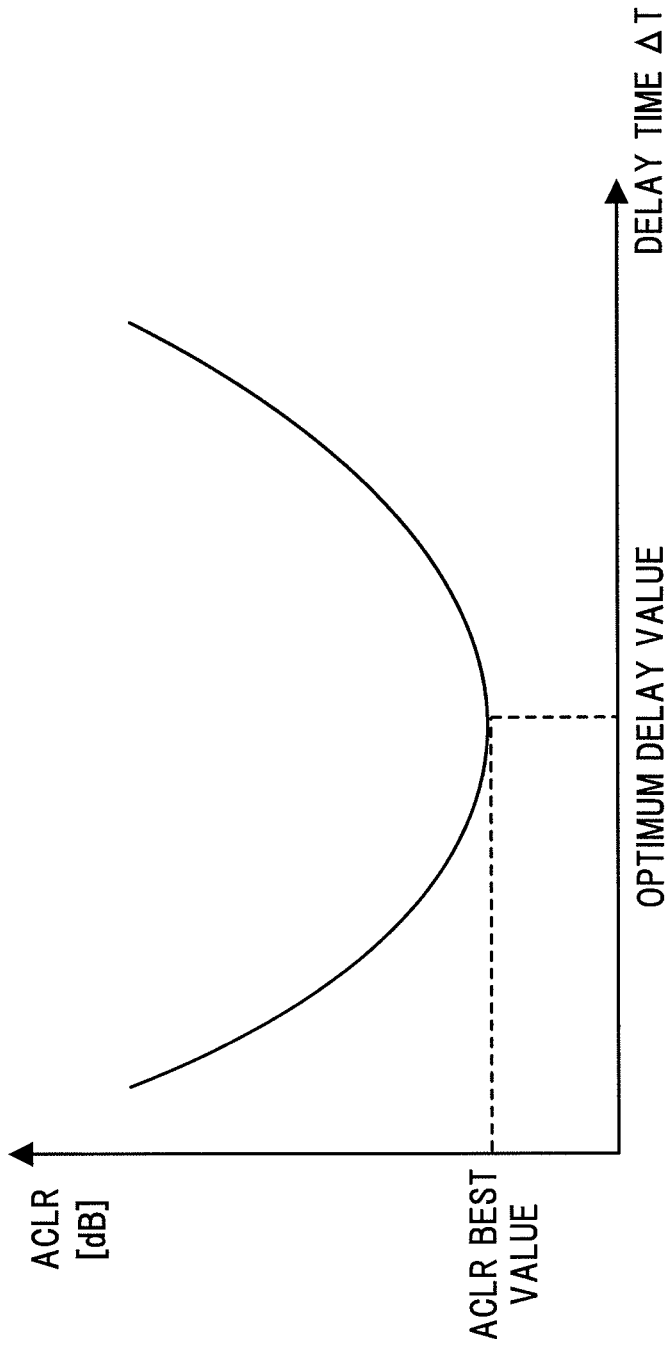
FIG. 7 is a diagram illustrating a relation between a delay time ΔT and an ACLR.

As indicated with a solid line in FIG. 7, the relation between the delay time ΔT the ACLR that is measured based on the demodulated data I and Q indicates that the ACLR has a desirable value [dB] at the optimum delay value. The value is separated from the ACLR best value [dB] as the value is separated from the optimum delay value. The ACLR is indicated with a negative value in FIG. 7. As for the longitudinal axis in the graph illustrated in FIG. 7, the downward direction indicates a direction in which the ACLR increases. In general, the larger the ACLR, the more preferable the characteristic.
(Process for Obtaining a Relation Between the Delay Time ΔT and the ACLR)

Figure 8:
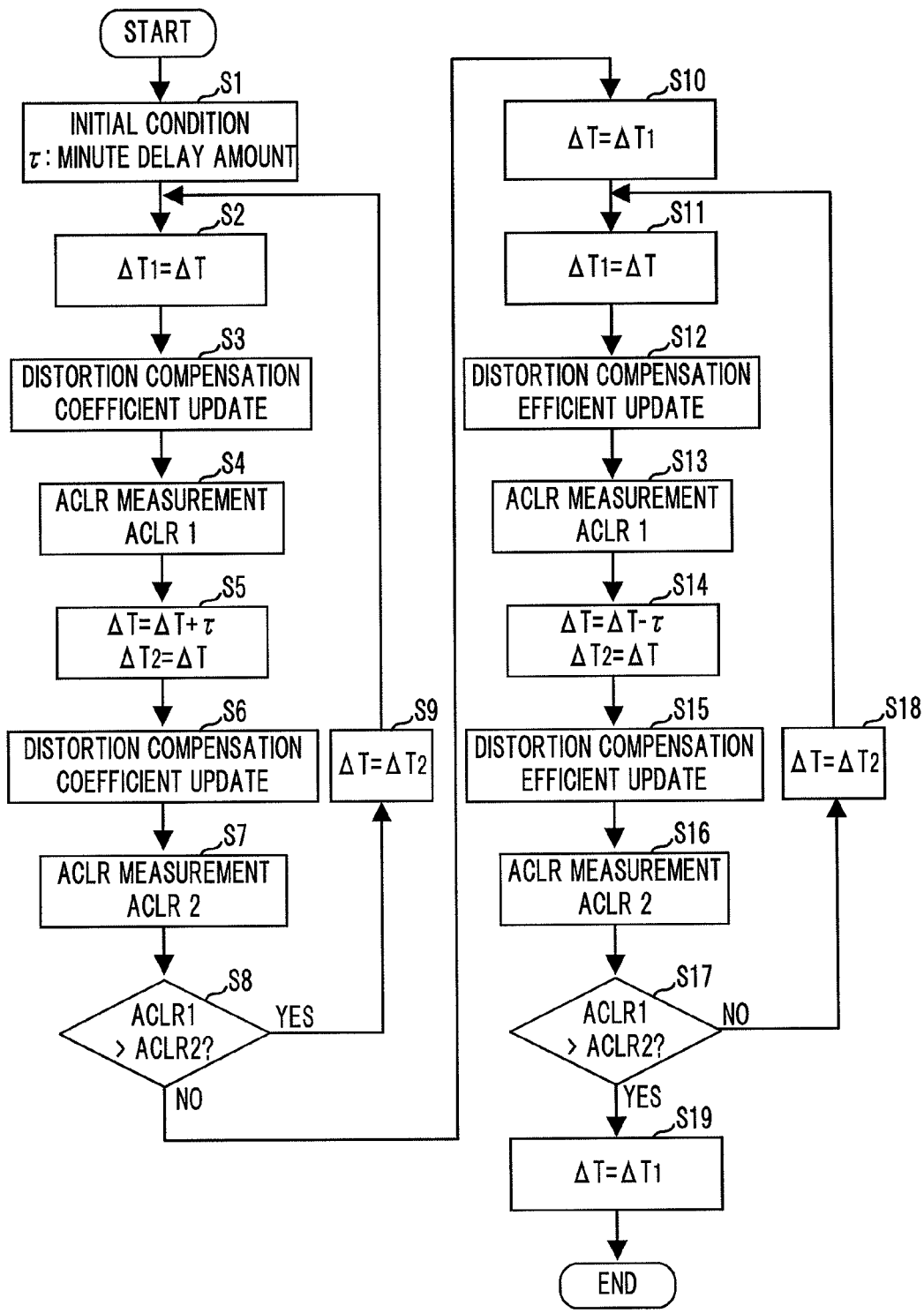
FIG. 8 is a flowchart of an embodiment of a process for obtaining the relation between the delay time ΔT and the ACLR.

FIG. 8 illustrates a flowchart of an embodiment of a process, performed by the ACLR measurement control unit 60, for obtaining a relation between the delay time ΔT and the ACLR. In Step S1, a minute delay amount τ is set as an initial condition, and the delay time ΔT is set to zero, for example. In Step S2, the value of the delay time ΔT of the variable delay unit 43b is set to ΔT1. In Step S3, the coefficient updating unit 55 updates the distortion compensation coefficient. In Step S4, the ACLR is measured and is maintained to be an ACLR 1.

In Step S5, the delay time ΔT of the variable delay unit 43b is increased by the minute delay amount τ. The value of the delay time ΔT of the variable delay unit 43b is set to ΔT2. In Step S6, the coefficient updating unit 55 updates the distortion compensation. In Step S7, the ACLR is updated and is maintained to be an ACLR 2.

In Step S8, the value of the ACLR 1 is compared to the value of the ACLR 2. If the ACLR 1 is larger than the ACLR 2, the ACLR increases and approaches the optimum delay value. Thus, in Step S19, the value of ΔT2 is set to the delay time ΔT of the variable delay unit 43b. The process goes to Step S2, and Step S2 to Step S8 are repeated.

On the other hand, in Step S8, if the ACLR 1 is equal to or larger than the ACLR 2, the process goes to Step S10. In Step S10, the value of ΔT1 is set to the delay time ΔT of the variable delay unit 43b. In Step S11, the value of the delay time ΔT of the variable delay unit 43b is set to ΔT1. In Step S12, the coefficient updating unit 55 updates the distortion compensation coefficient. In Step S13, the ACLR is measured and is maintained to be the ACLR 1.

In Step S14, the delay time ΔT of the variable delay unit 43b is increased by the minute delay amount τ. Furthermore, the value of the delay time ΔT of the variable delay unit 43b is set to ΔT2. In Step S15, the distortion compensation efficient is updated by the coefficient updating unit 55. In Step S16, the ACLR is measured and is maintained to be the ACLR 2.

In Step S17, the value of the ACLR 1 is compared to the value of the ACLR 2. If the ACLR 1 is equal to or larger than the ACLR 2, the value of ΔT2 is set to the delay time ΔT in Step S18 because the ACLR decreases and is separated from the optimum delay value. Then the process goes to Step S11. Then Step S11 to Step S17 are repeated.

On the other hand, in Step S17, if the ACLR 1 is larger than the ACLR 2, the process goes to Step S19. In Step S19, the value of ΔT1 is set to the delay time ΔT of the variable delay unit 43b, and the process is ended.

By performing the process illustrated in FIG. 8, the relation indicated with a solid line in FIG. 7 is obtained. The ACLR measurement control unit 60 sets the optimum delay value illustrated in FIG. 7 as the delay time ΔT to the variable delay unit 43b.

The process illustrated in FIG. 8 may be performed at the time of shipment from a factory, at application of power, at a change in the transmission signal power, or at a change in environmental temperature, or the like. Furthermore, the process may be performed at specified time intervals.

As described above, by adjusting the delay time ΔT while updating the distortion compensation coefficient, a point at which the ACLR has a desirable value is obtained. The point at which the ACLR has a desirable value is in a distortion compensation optimum state. Therefore, by setting the delay time ΔT at this moment as the optimum value to the variable delay unit 43b, it is possible to compensate the hysteresis of the power amplifier 48 sufficiently.

The first embodiment uses the address generating unit 43 and the distortion compensation coefficient generating unit 45 as an example of a distortion compensation signal generating unit, and uses the ACLR measurement control unit 60 and the variable delay unit 43b as an example of a delay amount control unit.
(Second Embodiment)

Figure 9:
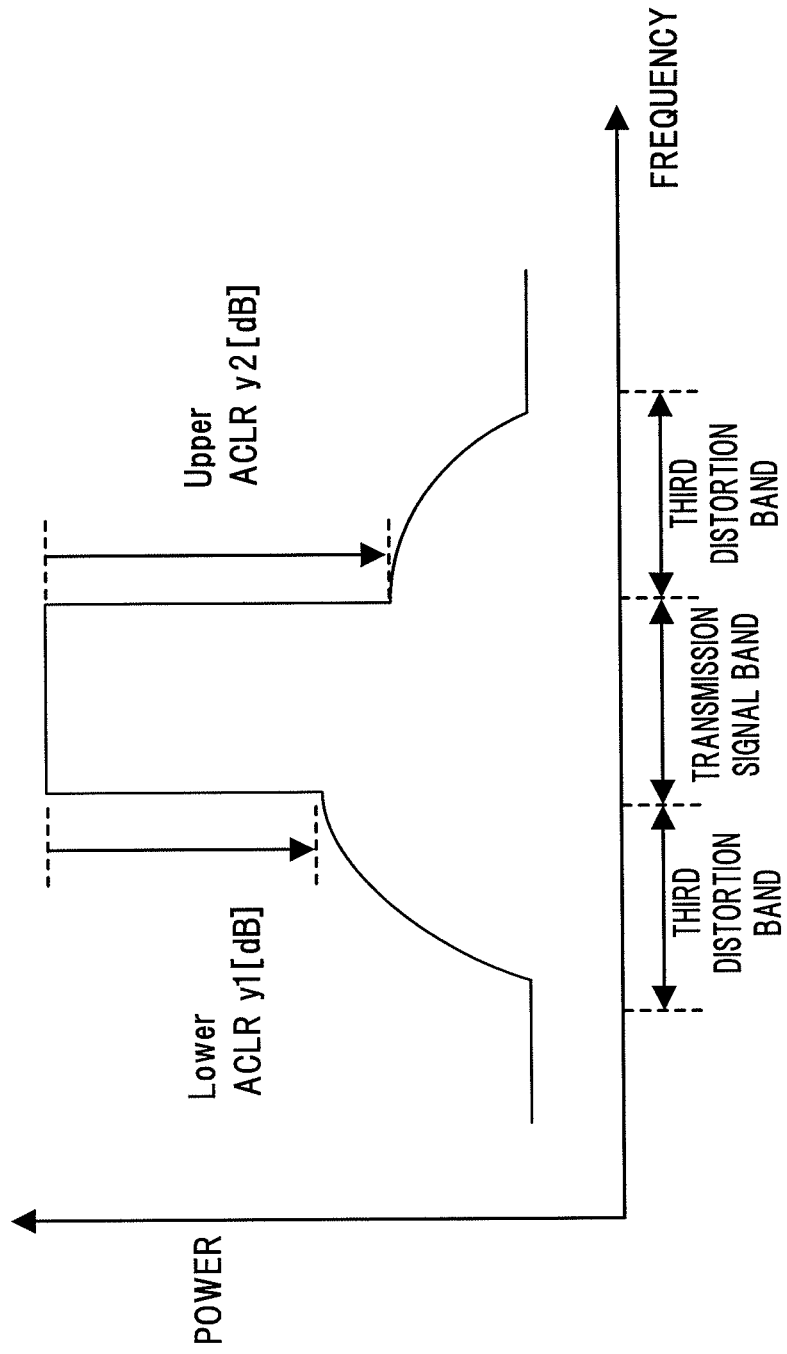
FIG. 9 is a diagram illustrating another frequency power spectrum of the transmission signal.

If the hysteresis is large, as illustrated in FIG. 9, the frequency power spectrum of the transmission signal is asymmetrical. That is, with respect to an ACLR value y1 [dB] on a low frequency side, an ACLR value y2 [dB] on a high frequency side increases. Thus, the ACLR difference (y1-y2) indicates the degree of influence of the hysteresis.

Figure 10:
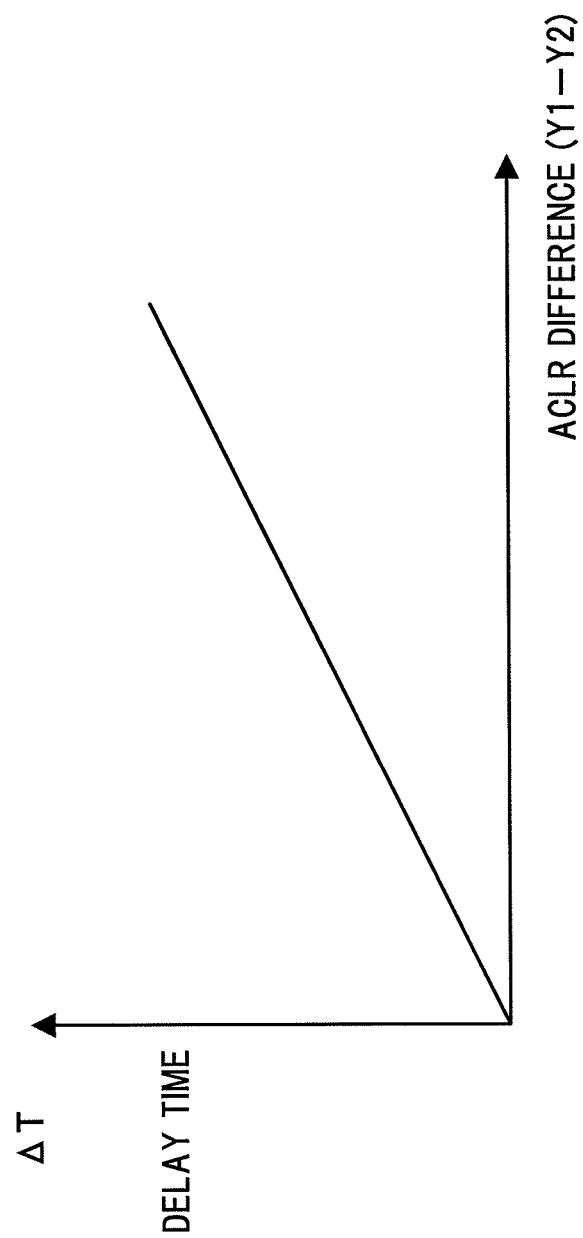
FIG. 10 is a diagram illustrating a relation between an ACLR difference and the delay time ΔT.

Therefore, the ACLR measurement control unit 60 of the predistorter illustrated in FIG. 5 calculates the ACLR difference (y1-y2). According to the relation indicated with a solid line in FIG. 10, the ACLR measurement control unit 60 obtains the delay time ΔT corresponding to the ACLR difference (y1-y2) and variably controls the delay time ΔT of the variable delay unit 43b. To obtain the above-described ACLR difference (y1-y2), the multiplier 42 allows the transmission data I and Q to go through without compensating the distortion of the transmission data I and Q. This configuration will be described below.

Accordingly, it is possible to compensate the hysteresis of the power amplifier 48 sufficiently. In the second embodiment, the process illustrated in FIG. 8 is not required.

(Third Embodiment)

Figure 11:
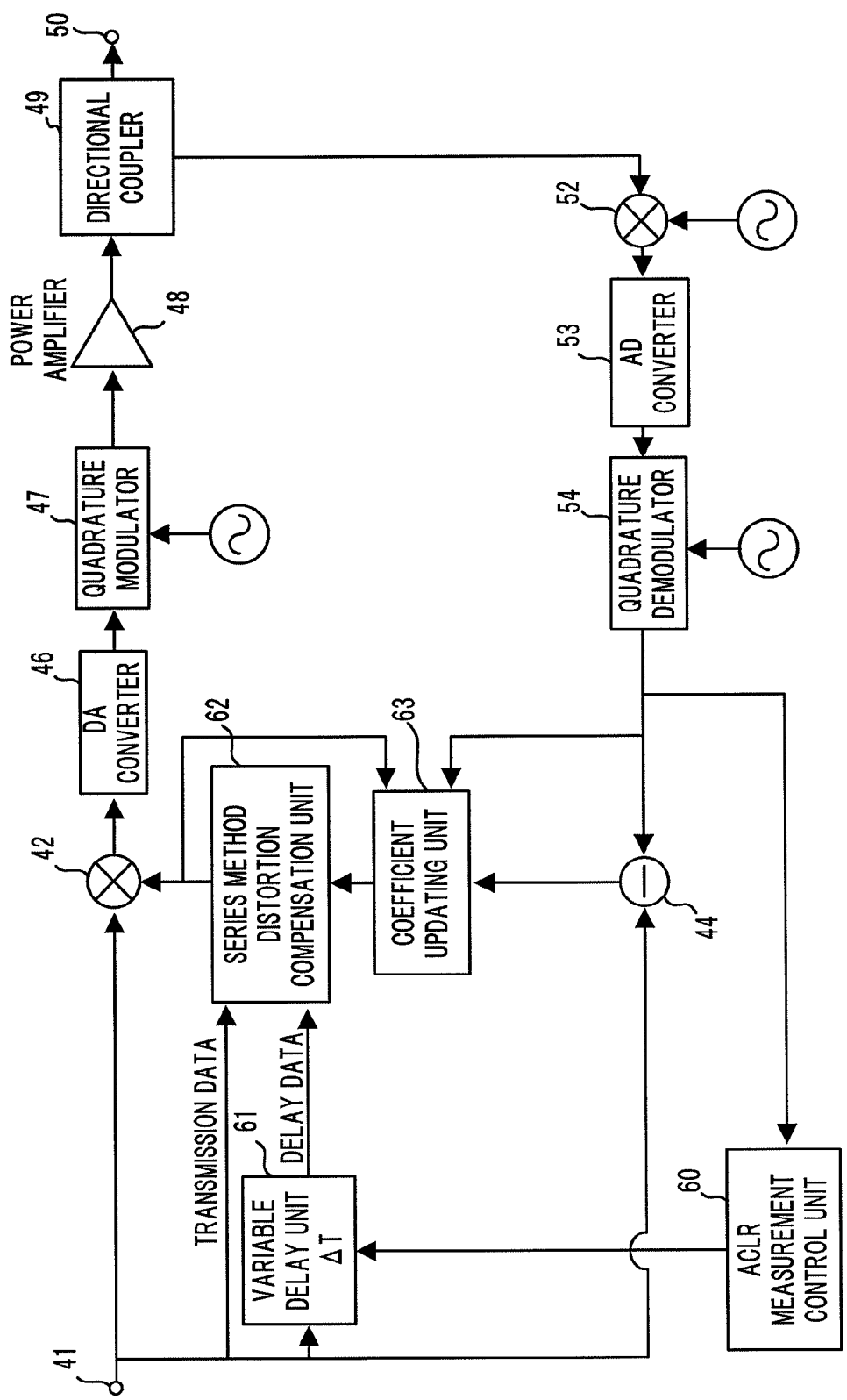
FIG. 11 is a configuration diagram of a third embodiment of the predistorter.

FIG. 11 illustrates a configuration diagram of a third embodiment of a predistorter. In FIG. 11, the same parts as in FIG. 5 are indicated with the same reference numerals. In the third embodiment, a series method distortion compensation unit 62 is used.

In FIG. 11, the transmission data I and Q are supplied to the terminal 41. The transmission data I and Q are supplied to the multiplier 42, the subtractor 44, the variable delay unit 61, and the series method distortion compensation unit 62.

The variable delay unit 61 varies the delay time ΔT according to the control signal supplied from the ACLR measurement control unit 60. The variable delay unit 61 delays the transmission data I and Q by the delay time ΔT and then supplies the transmission data I and Q as the delay data to the series method distortion compensation unit 62.

The series method distortion compensation unit 62 generates a distortion compensation coefficient by using a Volterra series or the like based on the transmission data I and Q and then supplies the distortion compensation coefficient to the multiplier 42.

The multiplier 42 performs the complex multiplication of the transmission data I and Q by the distortion compensation coefficient. The output of the multiplier 42 is converted into an analog signal by the DA converter 46 and is then supplied to the quadrature modulator 47 to be quadrature-modulated. The radio frequency quadrature-modulated signal output from the quadrature modulator 47 is power-amplified by the power amplifier 48 and is then output from the terminal 50 through the directional coupler 49.

Some of the radio frequency quadrature-modulated signals are taken out from the directional coupler 49 and are then converted into IF signals by the frequency converter 52. The IF signal is converted into a digital signal by the AD converter 53 and is then supplied to the quadrature demodulator 54. The quadrature demodulator 54 performs the quadrature demodulation of the digital IF signal. The demodulated data I and Q are supplied to the subtractor 44, the coefficient updating unit 55, and the ACLR measurement control unit 60.

The ACLR measurement control unit 60 obtains the ACLR that is measured based on the demodulated data I and Q by using the FFT or the like, and then variably controls the delay time ΔT of the variable delay unit 43b in such a way that the ACLR has a desirable value (the ACLR in the largest size).

The subtractor 44 obtains a difference (error) between the transmission data I and Q from the terminal 41 and the demodulated data I and Q and then supplies the difference to the coefficient updating unit 63. There is a delay unit (not illustrated) between the terminal 41 and the subtractor 44. The delay unit performs the time adjustment between the transmission data I and Q and the demodulated data I and Q.

Based on the distortion compensation coefficient generated by the series method compensation unit 62, the difference, and the demodulated data I and Q, the coefficient updating unit 63 obtains the updated distortion compensation coefficient. Next, a new distortion compensation coefficient, obtained by adding the updated distortion compensation coefficient, the distortion compensation coefficient generated by the series method distortion compensation unit 62, and the distortion compensation coefficient that is to be output from the series method distortion compensation unit 62, is supplied to the series method distortion compensation unit 62. Accordingly, the distortion compensation coefficient of the series method compensation unit 62 is updated.

In the third embodiment, by performing the process illustrated in FIG. 8 in the same manner as in the first embodiment, the delay time ΔT is adjusted while updating the distortion compensation coefficient to obtain a point at which the ACLR, indicated with a solid line in FIG. 7, has a desirable value. The point at which the ACLR has a desirable value is in the distortion compensation optimum state. Thus, by setting the delay time ΔT at this moment to the variable delay unit 61 as the optimum value, it is possible to compensate the hysteresis of the power amplifier 48 sufficiently.

In the present embodiment, the variable delay unit 61 and the series method distortion compensation unit 62 are used as an example of a distortion compensation signal generating unit, and the ACLR measurement control unit 60 and the variable delay unit 61 are used as an example of a delay amount control unit.

(Fourth Embodiment)

Figure 12:
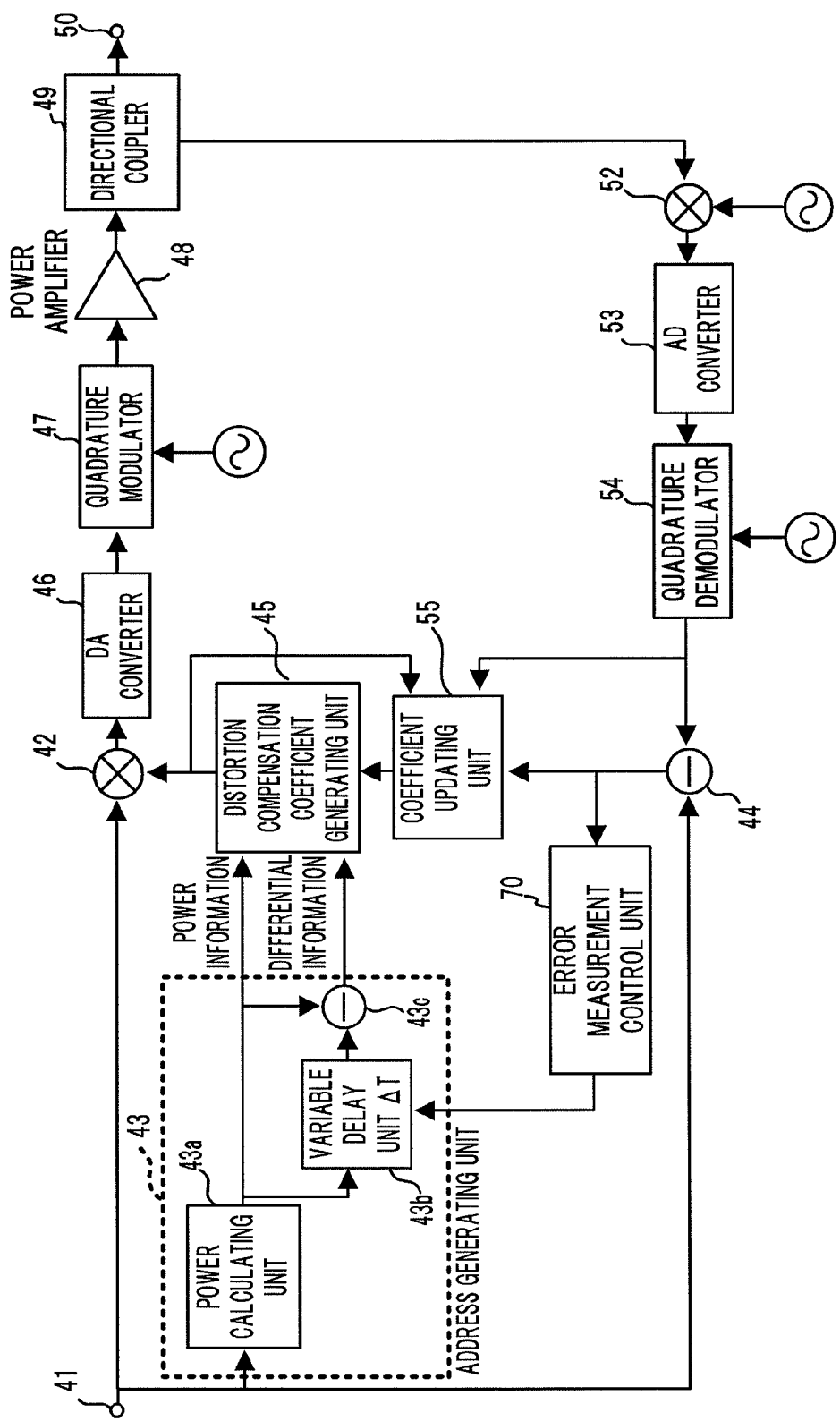
FIG. 12 is a configuration diagram of a fourth embodiment of the predistorter.

FIG. 12 illustrates a configuration diagram of a fourth embodiment of a predistorter. In FIG. 12, the same parts as in FIG. 5 are indicated with the same reference numerals. In the fourth embodiment, an error measurement control unit 70 is provided.

In FIG. 12, the transmission data I and Q are supplied to the terminal 41. The transmission data I and Q are supplied to the multiplier 42, the address generating unit 43, and the subtractor 44.

The address generating unit 43 includes the power calculating unit 43a, the variable delay unit 43b, and the subtractor 43c. The power calculating unit 43a calculates a power value based on the transmission data I and Q. The subtractor 43c obtains the differential power between the power value that is output from the power calculating unit 43a and the power value that is delayed by the variable delay unit 43b. The power value is output as a one-dimensional address, and the differential power is output as a two-dimensional address. The variable delay unit 43b varies the delay time ΔT according to the control signal supplied from the error measurement control unit 70.

The addresses (the one-dimensional address and the two-dimensional address) output from the address generating unit 43 are supplied to the distortion compensation coefficient generating unit 45. The distortion compensation coefficient generating unit 45 reads out the distortion compensation coefficient from the two-dimensional LUT by the above-described address and supplies the distortion compensation coefficient to the multiplier 42.

The multiplier 42 performs the complex multiplication of the transmission data I and Q by the distortion compensation coefficient. The output of the multiplier 42 is converted into an analog signal by the DA converter 46 and is then supplied to the quadrature modulator 47 to be quadrature-modulated. The radio frequency quadrature-modulated signal output from the quadrature modulator 47 is power-amplified by the power amplifier 48 and is then output from the terminal 50 through the directional coupler 49.

Some of the radio frequency quadrature-modulated signals are taken out from the directional coupler 49 and are then converted into IF signals by the frequency converter 52. The IF signal is converted into a digital signal by the AD converter 53 and is then supplied to the quadrature demodulator 54. The quadrature demodulator 54 performs the quadrature demodulation of the digital IF signal. The demodulated data I and Q are supplied to the subtractor 44, the coefficient updating unit 55, and the error measurement control unit 70.

The subtractor 44 obtains a difference (error) between the transmission data I and Q from the terminal 41 and the demodulated data I and Q and then supplies the difference to the coefficient updating unit 55 and the error measurement control unit 70. There is a delay unit (not illustrated) between the terminal 41 and the subtractor 44. The delay unit performs the time adjustment between the transmission data I and Q and the demodulated data I and Q.

The error measurement control unit 70 variably controls the delay time $\Delta T$ of the variable delay unit 43b to minimize the error, that is, the difference between the transmission data I and Q and the demodulated data I and Q.

Based on the distortion compensation coefficient that is read out from the distortion compensation coefficient generating unit 45, the difference, and the demodulated data I and Q, the coefficient updating unit 55 obtains the updated distortion compensation coefficient. A new distortion compensation coefficient, obtained by adding the updated distortion compensation coefficient and the distortion compensation coefficient read out from the distortion compensation coefficient generating unit 45, is supplied to the distortion compensation coefficient generating unit 45. Accordingly, the distortion compensation coefficient of the distortion compensation coefficient generating unit 45 is updated.

The relation between the delay time $\Delta T$ and the error measured based on the demodulated data I and Q indicates that the optimum delay value has the error minimum value, and the value is separated from the error minimum value as the value is separated from the optimum delay value.

Figure 13:
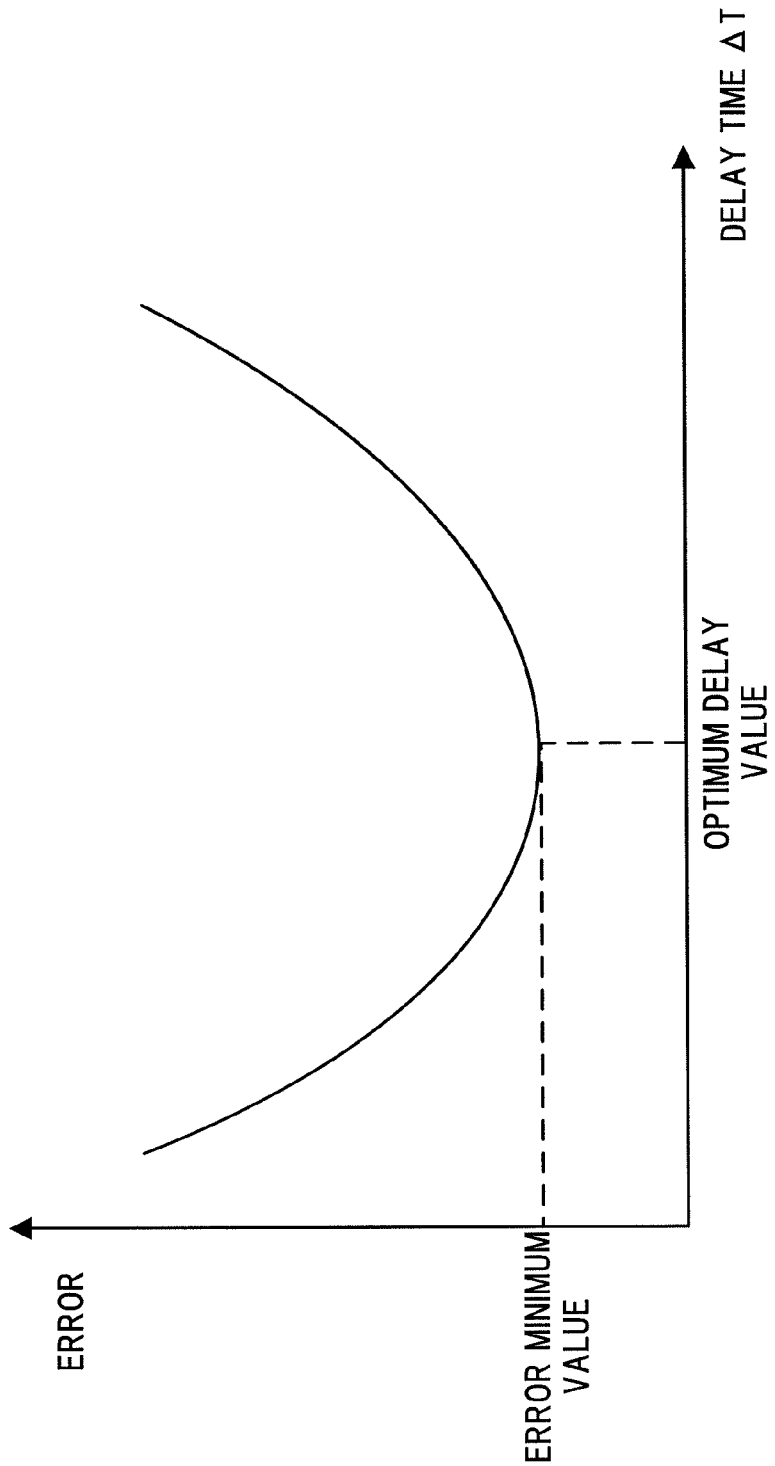
FIG. 13 is a diagram illustrating a relation between the delay time ΔT and an error.

By performing the process for replacing "ACLR" with "error" illustrated in FIG. 8, the error measurement control unit 70 adjusts the delay time $\Delta T$ while updating the distortion compensation coefficient as illustrated in FIG. 13 to obtain a point at which the error is the minimum. The point at which the error is the minimum is the optimum distortion compensation state. Thus, by setting the delay time $\Delta T$ at this moment to the variable delay unit 43b as the optimum value, it is possible to compensate the hysteresis of the power amplifier 48 sufficiently.

In the fourth embodiment, the address generating unit 43 and the distortion compensation coefficient generating unit 45 are used as an example of a distortion compensation signal generating unit, and the error measurement control unit 70 and the variable delay unit 43b are used as an example of a delay amount control unit.

(Fifth Embodiment)

Figure 14:
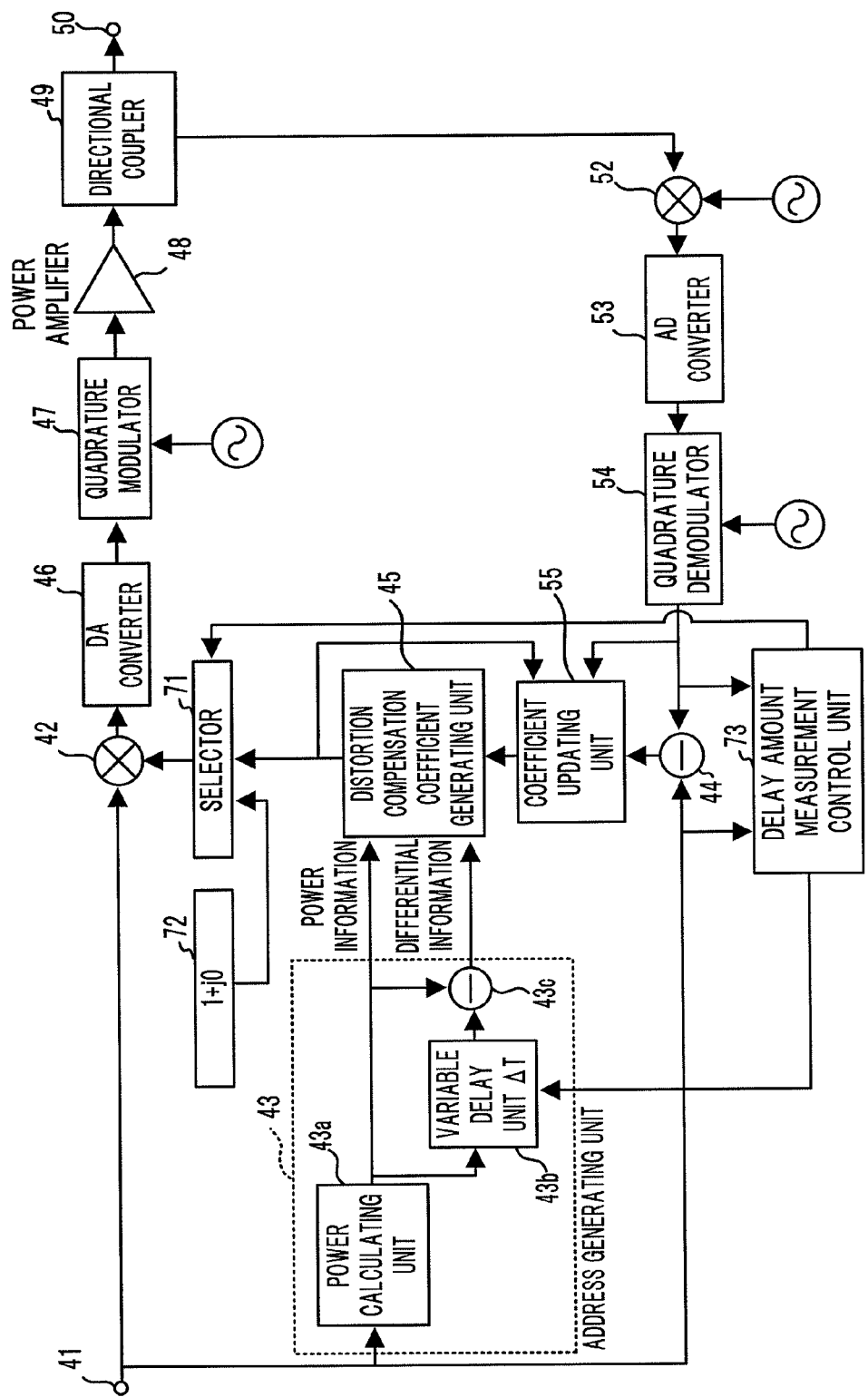
FIG. 14 is a configuration diagram of a fifth embodiment of the predistorter.
Figure 15:
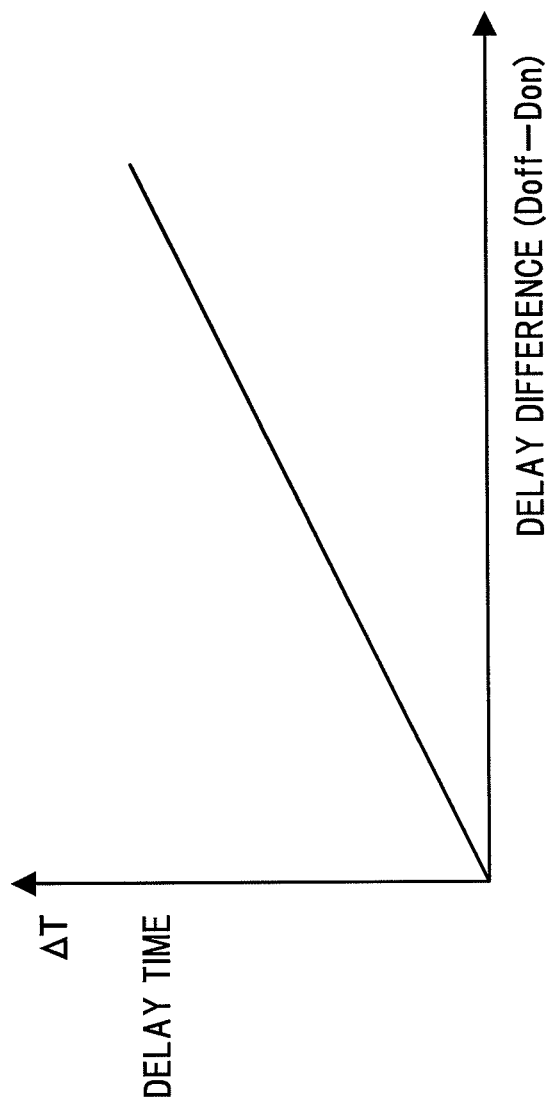
FIG. 15 is a diagram illustrating a relation between a delay difference and the delay time ΔT.

FIG. 14 illustrates a configuration diagram of a fifth embodiment of a predistorter. In FIG. 14, the same parts as in FIG. 5 are indicated with the same reference numerals. In the fifth embodiment, a delay amount measurement control unit 73 is used.

In FIG. 14, the transmission data I and Q are supplied to the terminal 41. The transmission data I and Q are supplied to the multiplier 42, the address generating unit 43, and the subtractor 44.

The address generating unit 43 includes the power calculating unit 43a, the variable delay unit 43b, and the subtractor 43c. The power calculating unit 43a calculates the power value based on the transmission data I and Q. The subtractor 43c obtains the differential power between the power value to be output from the power calculating unit 43a and a power value obtained by delaying the power value by the variable delay unit 43b. The power value is output as a one-dimensional address, and the differential power is output as a two-dimensional address. The variable delay unit 43b varies the delay time $\Delta T$ according to the control signal supplied from the delay amount measurement control unit 73.

The addresses (the one-dimensional address and the two-dimensional address) output from the address generating unit 43 are supplied to the distortion compensation coefficient generating unit 45. The distortion compensation coefficient generating unit 45 reads out the distortion compensation coefficient from the two-dimensional LUT based on the above-described addresses.

The distortion compensation coefficient generated by the distortion compensation coefficient generating unit 45 is supplied to a selector 71. A fixed coefficient "1+j0" that is output from a coefficient generating unit 72 is supplied to the selector 71. The selector 71 selects either the distortion compensation coefficient from the distortion compensation coefficient generating unit 45 or the fixed coefficient "1+j0" from the coefficient generating unit 72 under the control of the delay amount measurement control unit 73, and then supplies the selected coefficient to the multiplier 42.

The multiplier 42 performs the complex multiplication of the transmission data I and Q by the distortion compensation coefficient. When the fixed coefficient "1−Fj0" is supplied to the multiplier 42, the multiplier 42 allows the transmission data I and Q from the terminal 41 to go through without compensating the distortion.

The output of the multiplier 42 is converted into an analog signal by the DA converter 46 and is then supplied to the quadrature modulator 47 to be quadrature-modulated. The radio frequency quadrature-modulated signal output from the quadrature modulator 47 is power-amplified by the power amplifier 48 and is then output from the terminal 50 through the directional coupler 49.

Some of the radio frequency quadrature-modulated signals are taken out from the directional coupler 49 and are then converted into IF signals by the frequency converter 52. The IF signal is converted into a digital signal by the AD converter 53 and is then supplied to the quadrature demodulator 54. The quadrature demodulator 54 performs the quadrature demodulation of the digital IF signal. The demodulated data I and Q are supplied to the subtractor 44, the coefficient updating unit 55, and the delay amount measurement control unit 73.

The subtractor 44 obtains the difference (error) between the transmission data I and Q and the demodulated data I and Q and then supplies the difference to the coefficient updating unit 55. There is a delay unit (not illustrated) between the terminal 41 and the subtractor 44. The delay unit performs the time adjustment between the transmission data I and Q and the demodulated data I and Q.

Based on the distortion compensation coefficient that is read out from the distortion compensation coefficient generating unit 45, the difference, and the demodulated data I and Q, the coefficient updating unit 55 obtains the updated distortion compensation coefficient. Next, a new distortion compensation coefficient, obtained by adding the updated distortion compensation coefficient and the distortion compensation coefficient read out from the distortion compensation coefficient generating unit 45, is supplied to the distortion compensation coefficient generating unit 45. Accordingly, the distortion compensation coefficient of the distortion compensation coefficient generating unit 45 is updated.

The delay amount measurement control unit 73 allows the selector 71 to select the fixed coefficient "1+j0" and enters a state in which the distortion compensation is not performed. In this state, the delay amount measurement control unit 73 measures a delay amount Doff of the demodulated data I and Q from the quadrature demodulator 54 corresponding to the transmission data I and Q from the terminal 41. The delay amount Doff indicates that the hysteresis is not compensated. That is, a difference in the delay amount is generated because of the influence of the hysteresis.

Next, the delay amount measurement control unit 73 performs the distortion compensation by allowing the selector 71 to select the distortion compensation coefficient from the distortion compensation coefficient generating unit 45. In this state, the delay amount measurement control unit 73 measures a delay amount Don of the modulated data I and Q from the quadrature demodulator 54 corresponding to the transmission data I and Q from the terminal 41.

The delay amount measurement control unit 73 calculates a delay difference (Doff-Don), obtains the delay time $\Delta T$ corresponding to the delay difference (Doff-Don), and variably controls the delay time $\Delta T$ of the variable delay unit 43b. This makes it possible to compensate the hysteresis of the power amplifier 48 sufficiently.

In the fifth embodiment, the address generating unit 43 and the distortion compensation coefficient generating unit 45 are used as an example of a distortion compensation signal generating unit, and the delay amount measurement control unit 73 and the variable delay unit 43b are used as an example of a delay amount control unit.

(Sixth Embodiment)

Figure 16:
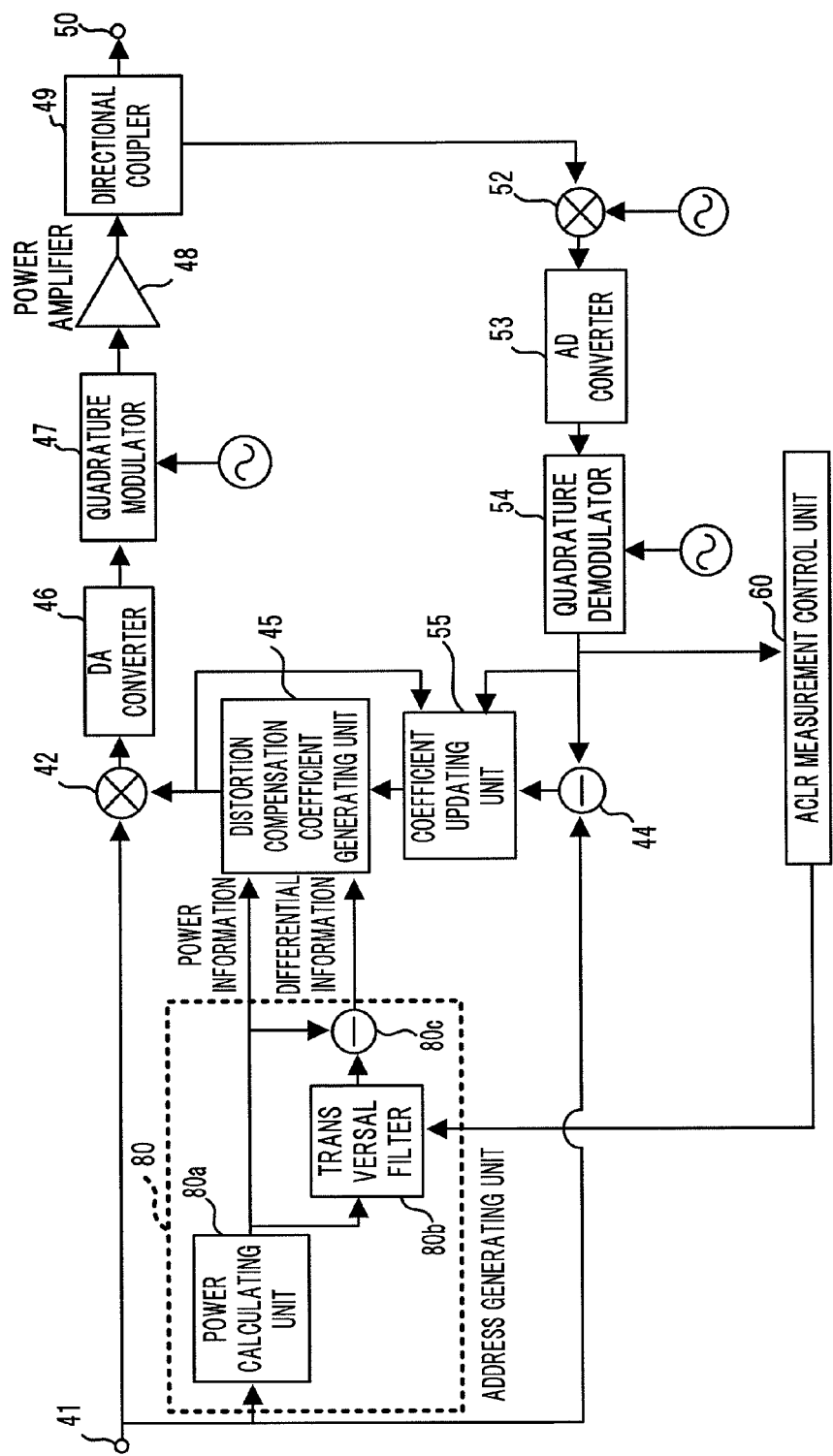
FIG. 16 is a configuration diagram of a sixth embodiment of the predistorter.

FIG. 16 illustrates a configuration diagram of a sixth embodiment of a predistorter. In FIG. 16, the same parts as in FIG. 5 are indicated with the same reference numerals. In the sixth embodiment, an address generating unit 80 is used.

In FIG. 16, the transmission data I and Q are supplied to the terminal 41. The transmission data I and Q are supplied to the multiplier 42, the address generating unit 80, and the subtractor 44.

The address generating unit 80 includes a power calculating unit 80a, a transversal filter 80b, and a subtractor 80c. The power calculating unit 80a calculates the power value based on the transmission data I and Q. The subtractor 80c obtains the differential power between the power value output from the power calculating unit 80a and the integration value of the power value integrated by the transversal filter 80b. The power value is output as a one-dimensional address, and the differential power is output as a two-dimensional address. The transversal filter 80b varies the delay time $\Delta T$ according to the control signal supplied from the ACLR measurement control unit 60.

Figure 17:
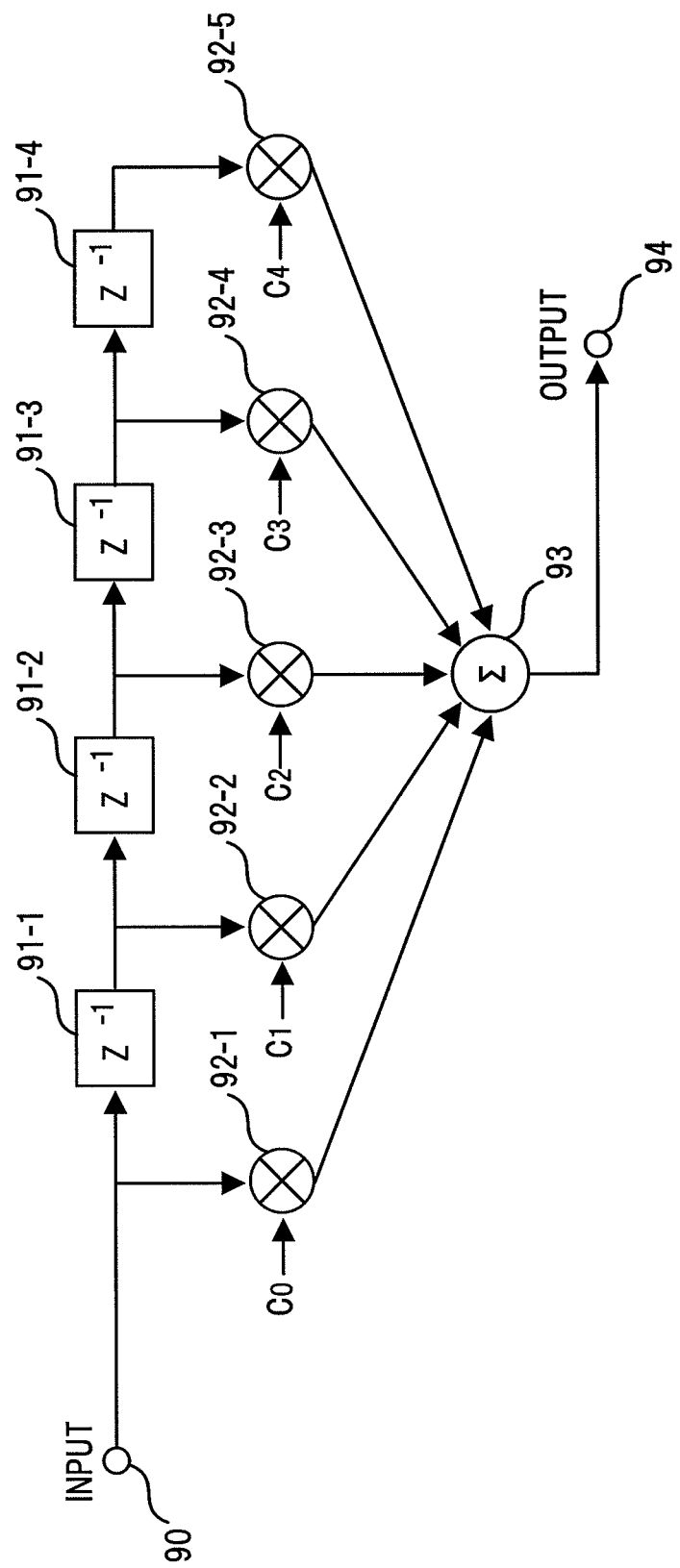
FIG. 17 is a configuration diagram of an embodiment of a transversal filter.

FIG. 17 illustrates a configuration diagram of an embodiment of a transversal filter having 5 taps. In FIG. 17, the transversal filter includes unit delay elements 91-1 to 91-4, multipliers 92-1 to 92-5, and an adder 93.

The input of a terminal 90 and inputs of each of the unit delay elements 91-1 to 91-4 are multiplied by tap coefficients C0 to C4 supplied from the ACLR measurement control unit 60 in each of the multipliers 91-1 to 92-5, respectively. Then the adder 93 obtains a total of the outputs of the multipliers 92-1 to 92-5 and then outputs the total from a terminal 94.

Figure 18A:
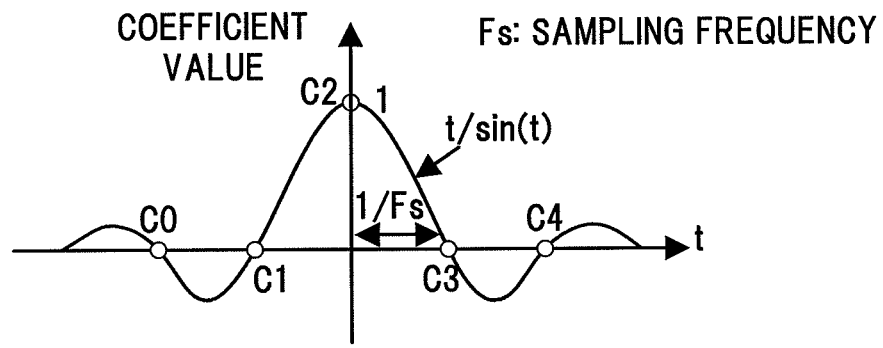
FIG. 18A, FIG. 18B, and FIG. 18C are diagrams illustrating operations of the transversal filter illustrated in FIG. 17.
Figure 18B:
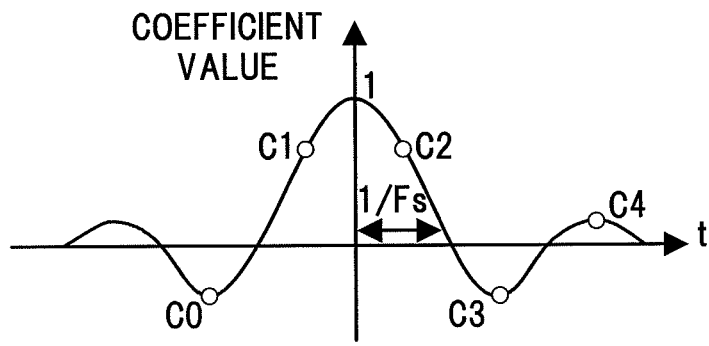

By setting the tap coefficients C0 to C4 as illustrated in FIG. 18A, the signal obtained by delaying the input signal by two samples (one sample=1/Fs) is output from the terminal 94. Fs is a sampling frequency. By setting the tap coefficients C0 to C4 as illustrated in FIG. 18B, the signal obtained by delaying the input signal by 1.5 samples is output. By setting the tap coefficients C0 to C4 as illustrated in FIG. 18C, the signal obtained by delaying the input signal by 1.5 samples is output.

Figure 18C:
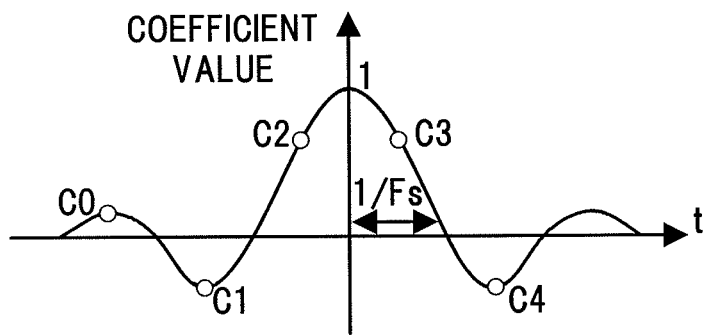

In the examples in FIG. 18A to FIG. 18C, a sinc function is used. If the tap length is short, a tap coefficient may be generated by using a function obtained by multiplying the sinc function by a window function.

The addresses (the one-dimensional address and the two-dimensional address) output from the address generating unit 43 are supplied to the distortion compensation coefficient generating unit 45. The distortion compensation coefficient generating unit 45 reads out the distortion compensation coefficient from the two-dimensional LUT by the above-described addresses and supplies the distortion compensation coefficient to the multiplier 42.

The multiplier 42 performs the complex multiplication of the transmission data I and Q by the distortion compensation coefficient. The output of the multiplier 42 is converted into an analog signal by the DA converter 46 and is then supplied to the quadrature modulator 47 to be quadrature-modulated. The radio frequency quadrature-modulated signal output from the quadrature modulator 47 is power-amplified by the power amplifier 48 and is then output from the terminal 50 through the directional coupler 49.

Some of the radio frequency quadrature-modulated signals are taken out from the directional coupler 49 and are then converted into IF signals by the frequency converter 52. The IF signal is converted into a digital signal by the AD converter 53 and is then supplied to the quadrature demodulator 54. The quadrature demodulator 54 performs the quadrature demodulation of the digital IF signal. The demodulated data I and Q are supplied to the subtractor 44, the coefficient updating unit 55, and the ACLR measurement control unit 60.

The ACLR measurement control unit 60 obtains the ACLR that is measured based on the demodulated data I and Q by using the FFT or the like and variably controls the delay time $\Delta T$ of the transversal filter 80b in such a way that the ACLR has a desirable value (the ACLR in the largest size).

The subtractor 44 obtains a difference (error) between the transmission data I and Q from the terminal 41 and the demodulated data I and Q and then supplies the difference to the coefficient updating unit 55. There is a delay unit (not illustrated) between the terminal 41 and the subtractor 44. The delay unit performs the time adjustment between the transmission data I and Q and the demodulated data I and Q.

Based on the distortion compensation coefficient read out from the distortion compensation coefficient generating unit 45, the difference, and the demodulated data I and Q, the coefficient updating unit 55 obtains the updated distortion compensation efficient. Next, a new distortion compensation coefficient, obtained by adding the updated distortion compensation coefficient and the distortion compensation coefficient read out from the distortion compensation coefficient generating unit 45, is supplied to the distortion compensation coefficient generating unit 45. Accordingly, the distortion compensation coefficient of the distortion compensation coefficient generating unit 45 is updated.

As described above, by using the transversal filter 80b, it is possible to improve compensation performance of the hysteresis because the delay time $\Delta T$ may be set to a smaller interval than the sampling interval of a digital circuit, that is, the delay time $\Delta T$ may be set with high accuracy.

In the sixth embodiment, the address generating unit 80 and the distortion compensation coefficient generating unit 45 are used as an example of a distortion compensation signal generating unit. The ACLR measurement control unit 60 and the transversal filter 80*b* are used as an example of a delay amount control unit.

According to the above-described embodiments, the compensation of hysteresis with high accuracy may be performed, so that the distortion compensation performance is improved. The distortion compensation performance may be maintained by following performance to a hysteresis change at time of operations by an automatic adjustment function. According to the above-described embodiments, it is possible to compensate the hysteresis of the power amplifier sufficiently. In addition, it is possible to reduce the number of man-hours for adjustment at the time of shipment from a factory.

As with the third embodiment, in the second, fourth, fifth, and sixth embodiments, the distortion compensation coefficient may be calculated by using a series method distortion compensation unit. Furthermore, as with the sixth embodiment, in the second embodiment to the fifth embodiment, an address generating unit using a transversal filter may be used.

Each of the above-described embodiments has a configuration in which the quadrature modulator 47 on a transmission side performs single conversion and the frequency converter 52 on a reproduction side and the quadrature demodulator 54 perform double conversion. However, in this case, either single conversion or double conversion may be performed. Moreover, the quadrature modulator 47 and the quadrature demodulator 54 may perform modulation and demodulation either analogically or digitally.

According to the above-described embodiments, it is possible to reduce the influence of a sneak wave in a radio relay device that relays a radio signal of a plurality of communication methods.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A predistorter comprising:
   a distortion compensating unit which gives, in advance, a reverse characteristic of a characteristic of input to output of a power amplifier to a transmission signal which is to be input to the power amplifier;
   a measurement control unit that measures one or more adjacent channel leakage power ratios in an output signal of the power amplifier;
   a delay unit which generates delayed transmission data by delaying transmission data that is sample data of the transmission signal by a delay time determined according to the one or more adjacent channel leakage power ratios in the output signal of the power amplifier; and
   a distortion compensation signal generating unit which generates a distortion compensation signal indicating the reverse characteristic based on the transmission data and the delayed transmission data,
   wherein the delay unit controls the delay amount of the transmission data according to a difference between an adjacent channel leakage power ratio on a low frequency said and the adjacent channel leakage power ratio on a high frequency side in the output signal of the power amplifier.

2. The predistorter according to claim 1, wherein the delay unit controls the delay amount of the transmission data to increase an adjacent channel leakage power ratio in the output signal of the power amplifier.

3. The predistorter according to claim 1, wherein the delay unit controls the delay amount of the transmission data to reduce an error of an input signal and the output signal of the power amplifier.

4. The predistorter according to claim 1, wherein the delay unit controls the delay amount of the transmission data according to a delay amount difference between the delay amount of the output signal of the power amplifier in a state where the distortion compensation is not performed and the delay amount of the output signal of the power amplifier in a state where the distortion compensation is performed.

5. The predistorter according to claim 1, wherein the delay unit delays the transmission data that is the sample data of the transmission signal by using a transversal filter.

6. The predistorter according to claim 1, wherein the distortion compensation signal generating unit generates the distortion compensation signal by using a look-up table.

7. The predistorter according to claim 1, wherein the distortion compensation signal generating unit generates the distortion compensation signal by using a series arithmetic operation.

8. A distortion compensation method comprising:
   compensating a distortion of a transmission signal by giving, in advance, a reverse characteristic of a characteristic of input to output of a power amplifier to the transmission signal which is to be input to the power amplifier;
   measuring one or more adjacent channel leakage power ratios in an output signal of the power amplifier;
   generating delayed transmission data by delaying transmission data that is sample data of the transmission signal by a delay time determined according to the one or more adjacent channel leakage power ratios in the output signal of the power amplifier; and
   generating a distortion compensation signal indicating the reverse characteristic based on the transmission data and the delayed transmission data,
   wherein the delayed transmission data generating includes controlling the delay amount of the transmission data according to a difference between an adjacent channel leakage power ratio on a low frequency side and the adjacent channel leakage power ratio on a high frequency in the output signal of the power amplifier.

9. The distortion compensation method according to claim 8, wherein the delayed transmission data generating includes controlling the delay amount of the transmission data to increase an adjacent channel leakage power ratio in the output signal of the power amplifier.

10. The distortion compensation method according to claim 8, wherein the delayed transmission data generating includes controlling the delay amount of the transmission data to reduce an error of an input signal and the output signal of the power amplifier.

11. The distortion compensation method according to claim 8, wherein the delayed transmission data generating includes controlling the delay amount of the transmission data according to a delay amount difference between the delay amount of the output signal of the power amplifier in a state where the distortion compensation is not performed and the delay amount of the output signal of the power amplifier in a state where the distortion compensation is performed.

12. The distortion compensation method according to claim 8, wherein the distortion compensation signal generating includes generating the distortion compensation signal by using a look-up table.

13. The distortion compensation method according to claim 8, wherein the distortion compensation signal generating includes generating the distortion compensation signal by using a series arithmetic operation.

* * * * *